United States Patent
Du et al.

(10) Patent No.: US 9,343,369 B2
(45) Date of Patent: May 17, 2016

(54) THREE DIMENSIONAL (3D) INTEGRATED CIRCUITS (ICS) (3DICS) AND RELATED SYSTEMS

(71) Applicant: QUALCOMM Incorporated, San Diego, CA (US)

(72) Inventors: Yang Du, Carlsbad, CA (US); Karim Arabi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/280,731

(22) Filed: May 19, 2014

(65) Prior Publication Data
US 2015/0333056 A1    Nov. 19, 2015

(51) Int. Cl.
*H01L 23/48*     (2006.01)
*H01L 21/822*    (2006.01)
*H01L 23/528*    (2006.01)
*H01L 23/522*    (2006.01)
*H01L 21/768*    (2006.01)
*H01L 21/50*     (2006.01)
*H01L 27/06*     (2006.01)

(52) U.S. Cl.
CPC ............ *H01L 21/8221* (2013.01); *H01L 21/50* (2013.01); *H01L 21/76895* (2013.01); *H01L 23/528* (2013.01); *H01L 23/5226* (2013.01); *H01L 27/0688* (2013.01); *H01L 27/0694* (2013.01); *H01L 2224/80006* (2013.01); *H01L 2224/80896* (2013.01); *H01L 2224/9202* (2013.01)

(58) Field of Classification Search
CPC .................... H01L 2924/01014; H01L 29/04; H01L 2924/01032; H01L 21/8221; H01L 24/83; H01L 25/50; H01L 29/7833; H01L 29/06
USPC ........... 257/546, E29.019, E21.505, E21.514, 257/E25.013, E27.026
See application file for complete search history.

(56) References Cited

U.S. PATENT DOCUMENTS

| | | | |
|---|---|---|---|
| 6,838,332 B1* | 1/2005 | Sanchez et al. | 438/239 |
| 7,402,897 B2* | 7/2008 | Leedy | 257/678 |
| 7,453,150 B1* | 11/2008 | McDonald | H01L 21/76898 257/773 |
| 8,146,032 B2* | 3/2012 | Chen et al. | 716/106 |
| 8,183,630 B2* | 5/2012 | Batude | H01L 27/11 257/296 |

(Continued)

OTHER PUBLICATIONS

Koyanagi, M. et al., "Research and Development of Transistor Structure in Nano-Scale Region," 2006 International Workshop on Nano CMOS, IEEE, Jan. 30, 2006, pp. 34-37.

(Continued)

*Primary Examiner* — Caleb Henry
(74) *Attorney, Agent, or Firm* — Withrow & Terranova, PLLC

(57) ABSTRACT

Methods for constructing three dimensional integrated circuits and related systems are disclosed. In one aspect, a first tier is constructed by creating active elements such as transistors on a holding substrate. An interconnection metal layer is created above the active elements. Metal bonding pads are created within the interconnection metal layer. A second tier is also created, either concurrently or sequentially. The second tier is created in much the same manner as the first tier and is then placed on the first tier, such that the respective metal bonding pads align and are bonded one tier to the other. The holding substrate of the second tier is then released. A back side of the second tier is then thinned, such that the back surfaces of the active elements (for example, a back of a gate in a transistor) are exposed. Additional tiers may be added if desired essentially repeating this process.

14 Claims, 14 Drawing Sheets

(56) References Cited

U.S. PATENT DOCUMENTS

| | | | |
|---|---|---|---|
| 8,258,517 B2* | 9/2012 | Yun et al. | 257/67 |
| 8,373,230 B1* | 2/2013 | Or-Bach | B82Y 10/00 257/347 |
| 8,574,929 B1* | 11/2013 | Or-Bach et al. | 438/4 |
| 8,618,670 B2* | 12/2013 | Gu et al. | 257/777 |
| 8,674,470 B1* | 3/2014 | Or-Bach et al. | 257/499 |
| 8,686,428 B1* | 4/2014 | Sekar et al. | 257/72 |
| 8,742,476 B1* | 6/2014 | Or-Bach et al. | 257/275 |
| 8,803,206 B1* | 8/2014 | Or-Bach et al. | 257/278 |
| 8,907,442 B2* | 12/2014 | Or-Bach et al. | 257/499 |
| 8,912,052 B2* | 12/2014 | Or-Bach | 438/129 |
| 9,099,526 B2* | 8/2015 | Or-Bach et al. | |
| 2007/0145367 A1* | 6/2007 | Chen et al. | 257/49 |
| 2007/0207592 A1 | 9/2007 | Lu et al. | |
| 2009/0032914 A1* | 2/2009 | Kwon et al. | 257/664 |
| 2011/0086468 A1* | 4/2011 | Felk | H01L 24/08 438/109 |
| 2011/0193212 A1* | 8/2011 | Gu et al. | 257/686 |
| 2012/0129301 A1* | 5/2012 | Or-Bach et al. | 438/129 |
| 2012/0153437 A1* | 6/2012 | Chen et al. | 257/546 |
| 2012/0193752 A1 | 8/2012 | Purushothaman et al. | |
| 2012/0228713 A1* | 9/2012 | Chen et al. | 257/369 |
| 2013/0135008 A1* | 5/2013 | Zhang et al. | 326/41 |
| 2013/0260510 A1 | 10/2013 | Theuss | |
| 2013/0267046 A1* | 10/2013 | Or-Bach et al. | 438/14 |
| 2014/0145272 A1* | 5/2014 | Or-Bach et al. | 257/369 |
| 2014/0151882 A1* | 6/2014 | Morimoto | H01L 28/88 257/739 |
| 2014/0225218 A1* | 8/2014 | Du | 257/499 |
| 2015/0115473 A1* | 4/2015 | Song et al. | 257/777 |

OTHER PUBLICATIONS

International Search Report and Written Opinion for PCT/US2015/026644, mailed Jul. 22, 2015, 15 pages.

* cited by examiner

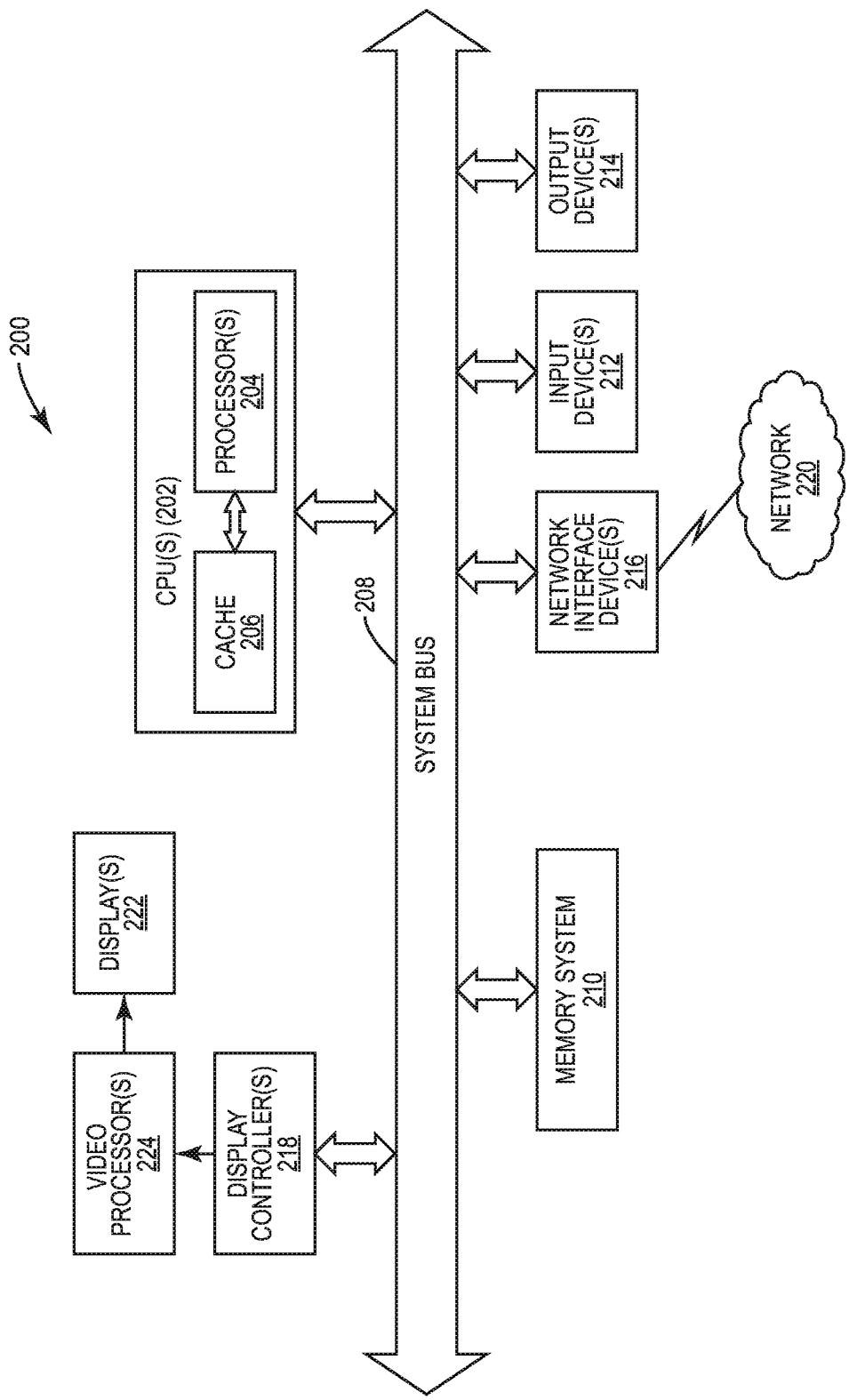

THREE DIMENSIONAL (3D) INTEGRATED CIRCUITS (ICS) (3DICS) AND RELATED SYSTEMS

BACKGROUND

I. Field of the Disclosure

The technology of the disclosure relates generally to the manufacture of three dimensional (3D) integrated circuits (ICs) (3DICs).

II. Background

Mobile communication devices have become prevalent in current society. The prevalence of these mobile devices is driven in part by the many functions that are now enabled on such devices. Demand for such functions increases processing capability requirements and generates a need for more powerful batteries. Within the limited space of a housing of a mobile communication device, batteries compete with processing circuitry. The limited space contributes pressure for continued miniaturization of components, and the space constrained batteries generates pressure for reduced power consumption by the circuitry. While miniaturization has been of particular concern in the integrated circuits (ICs) of mobile communication devices, efforts at miniaturization of ICs in other devices, such as desk top computers, have also occurred.

Historically, elements within an IC have all been placed in a single two dimensional (2D) active layer with elements interconnected through one or more metal layers that are also within the IC. Efforts to miniaturize ICs are reaching their limits in 2D spaces and thus, design thoughts have moved to three dimensions. While there have been efforts to connect two or more ICs through a separate set of metal layers outside the IC proper, that solution is not properly a three dimensional (3D) approach. Another proposal has been to stack two IC chips atop one another with connections made between the two IC chips through solder bumps (for example, the so called "flip chip" format). The flip chip format is sometimes referred to as a system in package (SIP) solution. There are other SIP solutions that stack IC chips atop one another with connections made between the chips with through silicon vias (TSVs). While arguably the flip chip and TSV aspects represent 3D solutions, the amount of space required to effectuate the flip chip remains large. Likewise, the space required to implement the TSV relative to the overall size of the chip becomes space prohibitive.

While there are several techniques that allow creation of a three dimensional integrated circuit (3DIC), each technique includes one or more drawbacks which makes use of the technique sub-optimal. For example, selective epitaxial layer growth is quite expensive to the point of being not commercially viable. Another technique uses a low temperature bonding process to effect a single crystal IC wafer transfer with subsequent active elements created on the transferred wafer. Such low temperature bonding may include oxide bonding and ion-cutting techniques, but processing wafers after transfer using these techniques will require low temperature (sub-500° C.) processing steps. Wafer processing at these low temperatures is challenging. Also, accidentally broken wafers may result in copper damage to the processing tool from copper interconnects within the IC. Thus, there remains a need for more options in fabricating 3DICs.

SUMMARY OF THE DISCLOSURE

Aspects disclosed in the detailed description include methods for constructing three dimensional (3D) integrated circuits (ICs) (3DICs) and related systems. In exemplary aspects of the present disclosure, a first tier of a 3DIC is constructed by creating active elements, such as transistors, on a holding substrate. An interconnection metal layer is created above the active elements. Metal bonding pads are created within the interconnection metal layer. A second tier is also created. The second tier is created in much the same manner as the first tier and is then placed on the first tier, such that the respective metal bonding pads align and are bonded one tier to the other. The holding substrate of the second tier is then released. A back side of the second tier is then thinned, such that the back surfaces of the active elements (for example, a back of a gate in a transistor) are exposed. Additional tiers may be added if desired essentially repeating this process.

Creating the tiers separately before bonding allows higher temperatures to be used in the creation of the active elements, which in turn provides greater flexibility in the creation of the active elements. The relatively low temperature bonding of the two tiers reduces the likelihood of metal damage from heating the metal layers. Likewise, during bonding, the existing active elements are not subjected to additional heating that might damage such active elements. By thinning the second tier, small vias may be created coupling additional metal layers within the tiers. The small vias allow a greater density of vias to be created without undue area penalties. Further, the thinned second layer allows a back gate bias to be provided to the transistors, which provides additional flexibility in circuit design.

In this regard of one aspect a method of forming a 3DIC is disclosed. The method comprises forming a first tier. The first tier is formed by providing a first holding substrate. The first tier is further formed by forming a first transistor above the first holding substrate. The first tier is further formed by forming a first interconnection metal layer above the first transistor including a first metal bonding pad. The method also comprises forming a second tier. The second tier is formed by providing a second holding substrate. The second tier is also formed by forming a second transistor above the second holding substrate. The second tier is also formed by forming a second interconnection metal layer above the second transistor including a second metal bonding pad. The method also comprises bonding the first metal bonding pad to the second metal bonding pad. The method also comprises releasing the second holding substrate and exposing a second back surface of a second gate of the second transistor.

In another aspect, a method of forming a 3DIC is disclosed. The method comprises forming a first tier. The first tier is formed by providing a first holding substrate. The first tier is also formed by forming a first transistor above the first holding substrate. The first tier is also formed by forming a first metal layer above the first transistor. The first tier is also formed by bonding a first supporting substrate to the first tier above the first metal layer. The first tier is also formed by releasing the first holding substrate and exposing a first back surface of a first gate of the first transistor. The first tier is also formed by adding a first interconnection metal layer above the first back surface of the first gate including a first metal bonding pad. The method also comprises forming a second tier. The second tier is formed by providing a second holding substrate. The second tier is also formed by forming a second transistor above the second holding substrate. The second tier is also formed by forming a second interconnection metal layer above the second transistor including a second metal bonding pad. The method also comprises bonding the first metal bonding pad to the second metal bonding pad. The method also comprises releasing the second holding substrate and exposing a second back surface of a second gate of the second transistor.

In another aspect, a 3DIC is disclosed. The 3DIC comprises a first tier. The first tier comprises a first holding substrate. The first tier also comprises a first transistor positioned above the first holding substrate. The first tier also comprises a first interconnection metal layer positioned above the first transistor, wherein the first interconnection metal layer comprises a first metal bonding pad. The 3DIC also comprises a second tier. The second tier comprises a second interconnection metal layer comprising a second metal bonding pad bonded to the first metal bonding pad. The second tier also comprises a second transistor positioned above the second interconnection metal layer, the second transistor comprising a second gate and a second gate back surface. The second tier also comprises a second back gate bias positioned above and proximate the second gate back surface.

In another aspect, a 3DIC is disclosed. The 3DIC comprises a first tier. The first tier comprises a first holding substrate. The first tier also comprises a first interconnection metal layer positioned above the first holding substrate. The first tier also comprises a first transistor positioned above the first interconnection metal layer. The first tier also comprises a first metal back layer positioned above the first transistor, wherein the first metal back layer comprises a first metal bonding pad. The first tier also comprises a via coupling the first metal back layer to the first interconnection metal layer. The 3DIC also comprises a second tier. The second tier comprises a second interconnection metal layer comprising a second metal bonding pad bonded to the first metal bonding pad. The second tier also comprises a second transistor positioned above the second interconnection metal layer, the second transistor comprising a second gate and a second gate back surface. The second tier also comprises a second back gate bias positioned above and proximate the second gate back surface.

BRIEF DESCRIPTION OF THE FIGURES

FIG. 14 is a block diagram of an exemplary processor-based system that can include the 3DIC formed according to the processes of FIG. 1 or 6.

DETAILED DESCRIPTION

Figure 1:
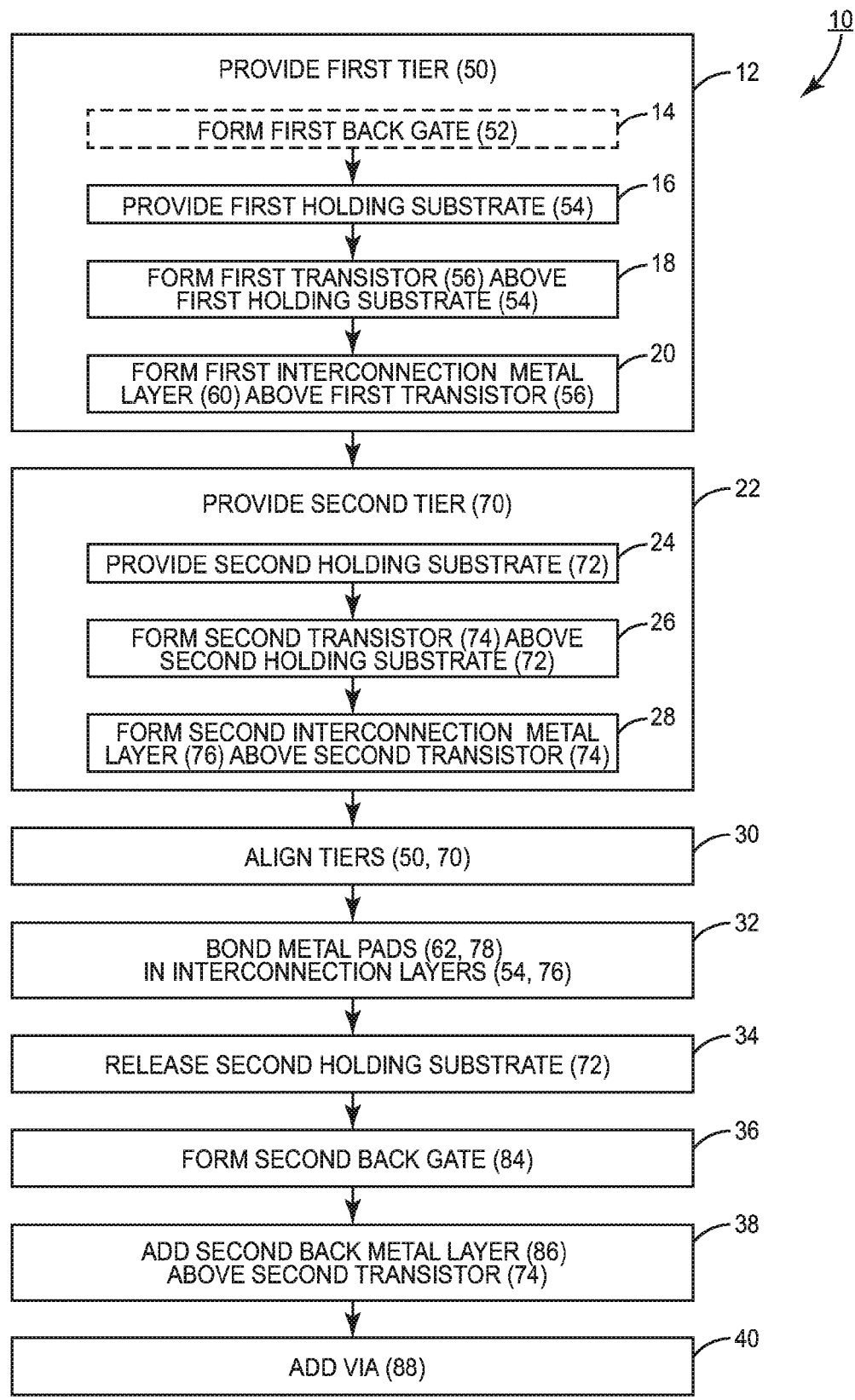
FIG. 1 is a flow chart of an exemplary method to construct a three dimensional integrated circuit (3DIC) according to an exemplary aspect of the present disclosure.
Figure 2:
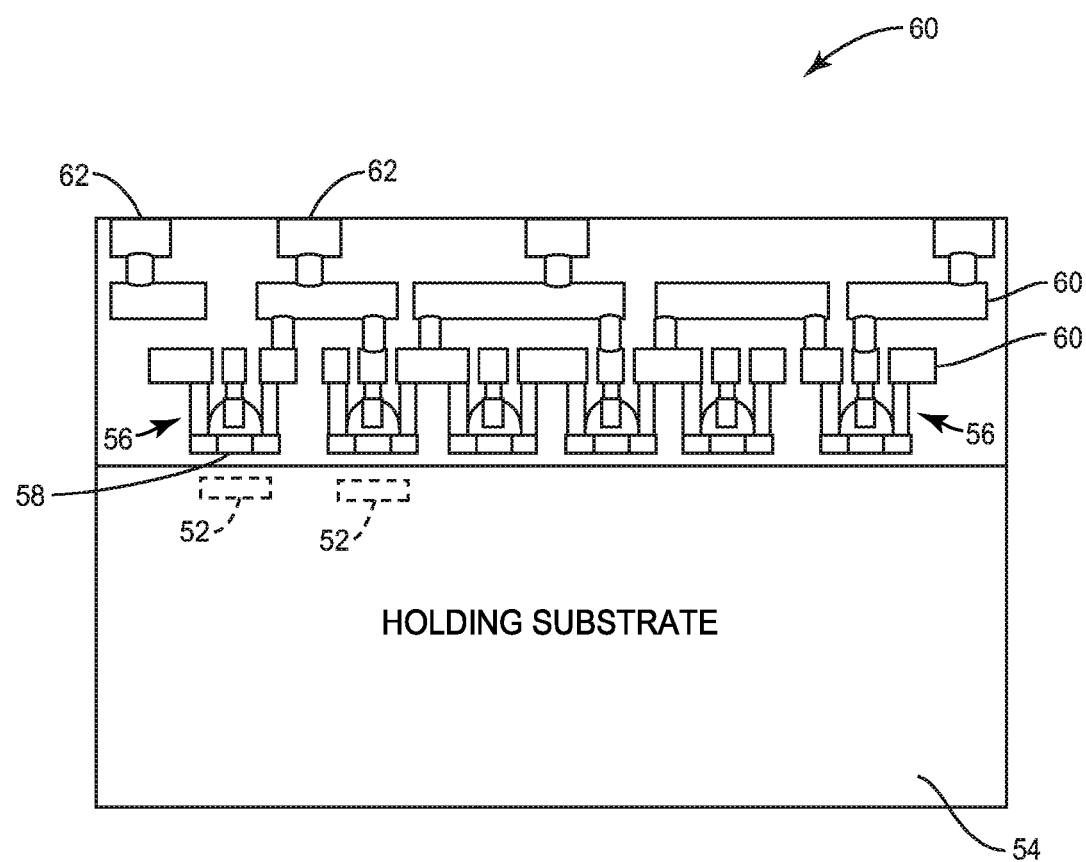
FIG. 2 is a simplified cross-sectional view of a first tier of a 3DIC formed according to the process of FIG. 1.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include methods for constructing three dimensional (3D) integrated circuits (ICs) (3DICs) and related systems. In exemplary aspects of the present disclosure, a first tier of a 3DIC is constructed by creating active elements, such as transistors, on a holding substrate. An interconnection metal layer is created above the active elements. Metal bonding pads are created within the interconnection metal layer. A second tier is also created, either concurrently or sequentially. The second tier is created in much the same manner as the first tier and is then placed on the first tier such that the respective metal bonding pads align and are bonded one tier to the other. The holding substrate of the second tier is then released. A back side of the second tier is then thinned, such that the back surfaces of the active elements (for example, a back of a gate in a transistor) are exposed. Additional tiers may be added if desired essentially repeating this process.

Creating the tiers separately before bonding allows higher temperatures to be used in the creation of the active elements, which in turn provides greater flexibility in the creation of the active elements. The relatively low temperature bonding of the two tiers reduces the likelihood of metal damage from heating the metal layers. Likewise, the existing active elements are not subjected to additional heating that might damage such active elements. By thinning the second tier, small vias may be created coupling additional metal layers within the tiers. The small vias allow a greater density of vias to be created without undue area penalties. Further, the thinned second layer allows a back gate bias to be provided to the transistors, which provides additional flexibility in circuit design.

Figure 4:
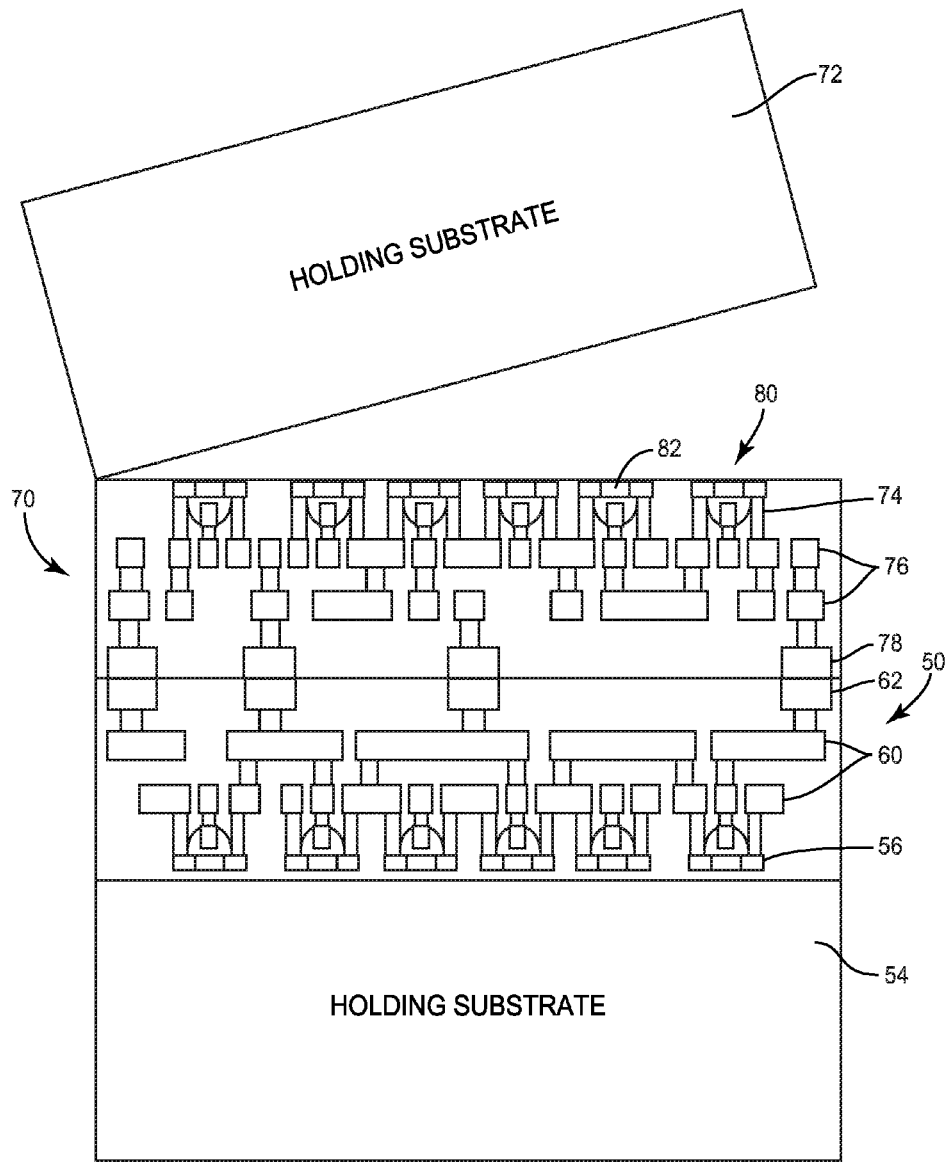
FIG. 4 is a simplified cross-sectional view of the first tier of FIG. 2 bonded to the second tier of FIG. 3 according to the process of FIG. 1.
Figure 5:
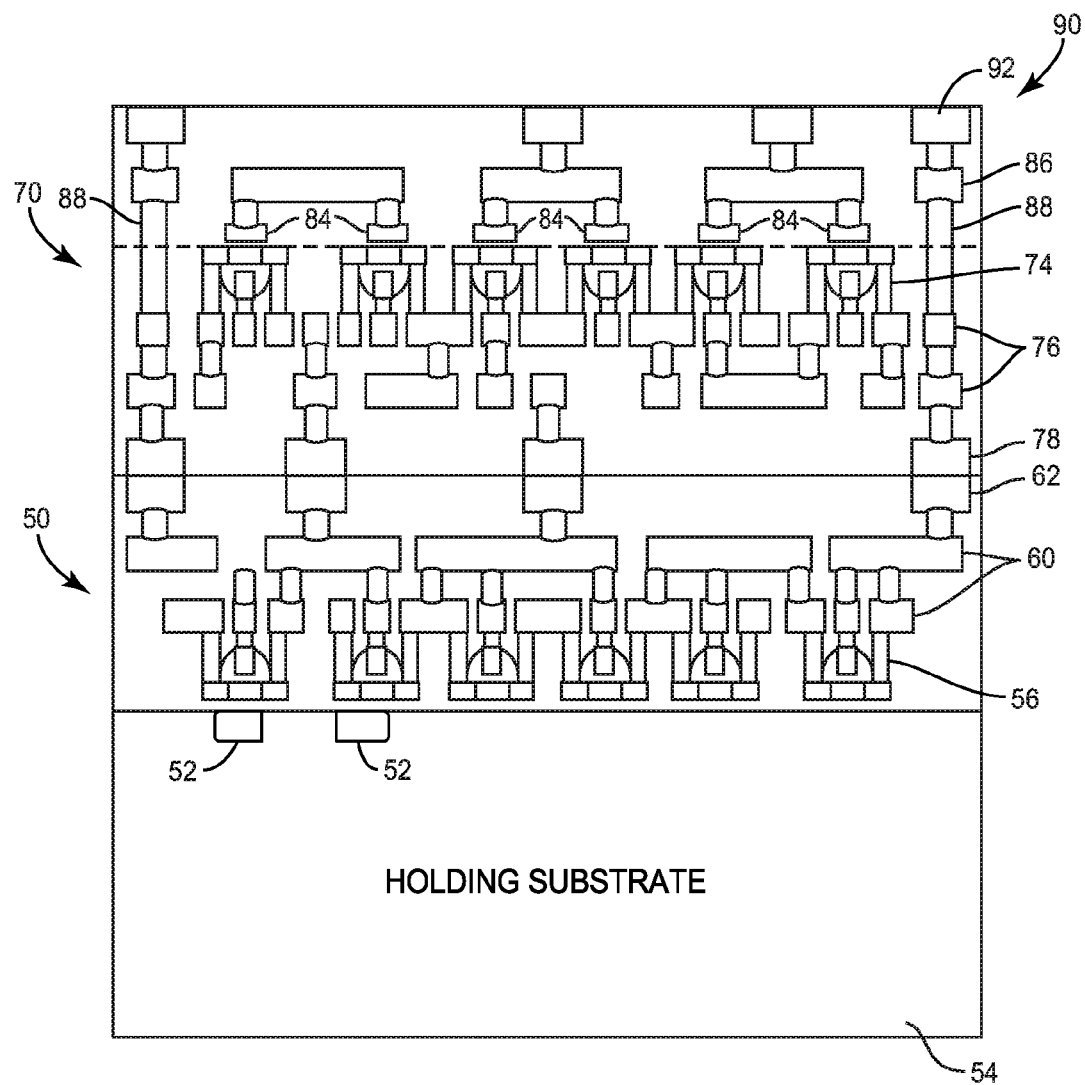
FIG. 5 is a simplified cross-sectional view of additional metal layers and vias added to the second tier according to the process of FIG. 1.

In this regard, FIG. 1 is an exemplary flow chart of a first process 10 for forming a 3DIC 90 (FIG. 5). FIGS. 2-5 provide an illustration of the steps of process 10 and will be referred to throughout the description of FIG. 1. The process 10 begins with providing a first tier 50 for the 3DIC 90 (block 12, see FIGS. 2, 5). Providing the first tier 50 for the 3DIC 90 may include the optional step of creating first back gate(s) 52 in a first holding substrate 54 (block 14). In an exemplary aspect, such first back gate 52 may be a doped silicon substrate region or other pre-fabricated materials such as TiN (Titanium Nitride) or other materials. In an exemplary aspect, the first holding substrate 54 is glass or other insulator to form a silicon on insulator (SOI) first tier 50. In another exemplary aspect, the first holding substrate 54 is bulk silicon. After implanting the optional first back gate(s) 52 in the first holding substrate 54, the first holding substrate 54 is provided (block 16) for further processing. In particular, active elements may be formed on the first holding substrate 54. In an exemplary aspect, one or more first transistors 56 are formed on (i.e., above) the first holding substrate 54 (block 18, see FIG. 2). While first transistors 56 are contemplated, it should be appreciated that capacitors, inductors, or other elements may be formed as needed or desired. Each first transistor 56 may have a first gate 58 that is aligned with the first back gate 52. The existence of the first back gate 52 allows the threshold voltage ($V_T$) of the first transistor 56 to be varied as needed or desired providing greater flexibility in circuit design. Returning to process 10, first interconnection metal layer(s) 60 are formed above the first transistors 56 (block 20). While two first interconnection metal layers 60 are shown, more interconnection metal layers 60 may be provided. First interconnection metal layers 60 provide interconnection between different active elements within the first tier 50 (e.g., between two first transistors 56). During creation of the first interconnection metal layers 60, first metal bonding pad(s) 62 may also be formed.

Figure 3:
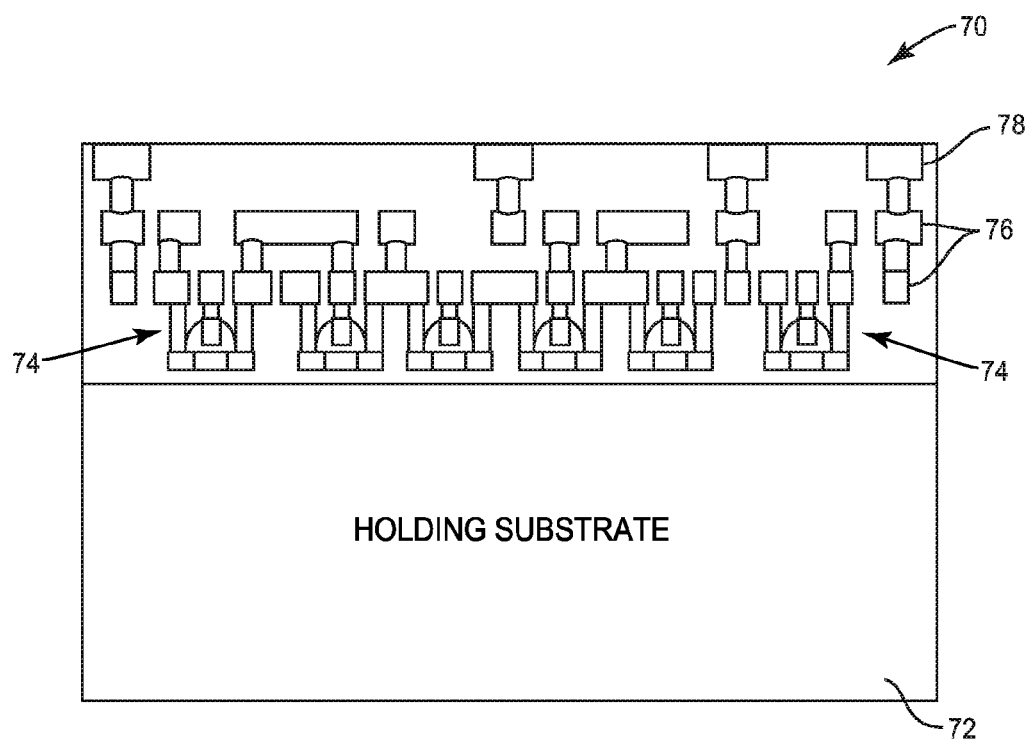
FIG. 3 is a simplified cross-sectional view of a second tier of a 3DIC formed according to the process of FIG. 1.

With continued reference to FIG. 1, the process 10 continues by providing a second tier 70 (block 22, see FIG. 3). Providing the second tier 70 includes providing a second holding substrate 72 (block 24, see FIG. 3). As with the first holding substrate 54, the second holding substrate 72 may be an insulator or bulk silicon. Active elements are formed on the second holding substrate 72. In an exemplary aspect, the active elements include at least one second transistor 74 formed above the second holding substrate 72 (block 26, see FIG. 3). A second interconnection metal layer(s) 76 is formed above the second transistor(s) 74 (block 28, see FIG. 3). While only two second interconnection metal layers 76 are illustrated, more may be provided if needed or desired. Second interconnection metal layer 76 provides interconnection between active elements within the second tier 70 (e.g., between two second transistors 74). During creation of the second interconnection metal layer 76, second metal bonding pad(s) 78 may also be formed.

With continued reference to FIG. 1, process 10 continues by flipping the second tier over and onto the first tier 50 and aligning the tiers 50, 70 (block 30). In particular, the metal bonding pads 62 and 78 are aligned. Once aligned, the metal bonding pads 62, 78 of the interconnection metal layers 60, 76 are bonded (block 32) such as by oxide bonding. In addition to bonding the first tier 50 to the second tier 70, this arrangement electrically interconnects interconnection metal layers 60, 76 such that elements within the first tier 50 may be electrically interconnected to elements in the second tier 70. Oxide bonding is also able to be done at relatively low temperatures. Use of such low temperatures reduces the chance of metal damage from melting the interconnection metal layers 60, 76.

With continued reference to FIG. 1, process 10 continues by releasing the second holding substrate 72 (block 34, see FIG. 4). Releasing the second holding substrate 72 may be done by ion cutting, etching (e.g., wet chemical dissolution), chemical mechanical polishing (CMP) (e.g., back lapping), or other wafer thinning technique. In an exemplary aspect of the present disclosure, releasing the second holding substrate 72 exposes a second back surface 80 of a second gate 82 of a second transistor 74. Where the holding type of material of the second holding substrate 72 is an insulator, the releasing of the second holding substrate 72 may thin the second back surface 80 to the transition between the insulator and the silicon body (i.e., the transistor type of material). Such transition is relatively easy to detect. Where the second holding substrate 72 is bulk silicon, the thinning may be measured to achieve a desired thickness.

With continued reference to FIG. 1, process 10 continues with the formation of a second back gate 84 on the exposed second back surface 80 (block 36, see FIG. 5). Use of second back gate 84 allows the threshold voltage ($V_T$) of the second transistors 74 to be varied as is well understood, providing greater flexibility for the 3DIC 90. Additional second back metal layer(s) 86 are formed above the second transistor 74 (block 38, see FIG. 5). Note that because the second transistor 74 has flipped upside down, "above" is now the opposite of the "above" in block 28. To this extent, as used herein, terms like "above" are intended to convey relative position and not absolute positions. Additionally, vias 88 are created between the second back metal layers 86 and the second interconnection metal layers 76 (block 40, see FIG. 5). If additional tiers are to be added beyond the first tier 50 and the second tier 70, additional second back metal bonding pads 92 may be formed with the second back metal layers 86.

Note that if the release of the second holding substrate 72 has thinned the second back surface 80 appropriately, the distance that must be traversed by the vias 88 may be relatively short. The shorter the distance for the vias 88, the easier it is to form the vias 88 and the more vias 88 that may be placed in a given area. That is, conventional via formation techniques cause the horizontal area consumed by a via to increase as the vertical length of the via increases. By design, the vertical distance in the second tier 70 is short, so the horizontal area required is relatively small, which provides more space for additional vias 88 to be created.

The process 10 is referred to herein as a "face to face" assembly process in that the two tiers are assembled face to face. While this is effective for the first two tiers 50, 70 subsequent tiers may require a "face to back" process 100 such as that illustrated in FIGS. 6-13. Again, the process 100 is presented in FIG. 6 while FIGS. 7-13 show the steps used in the process 100.

Figure 6:
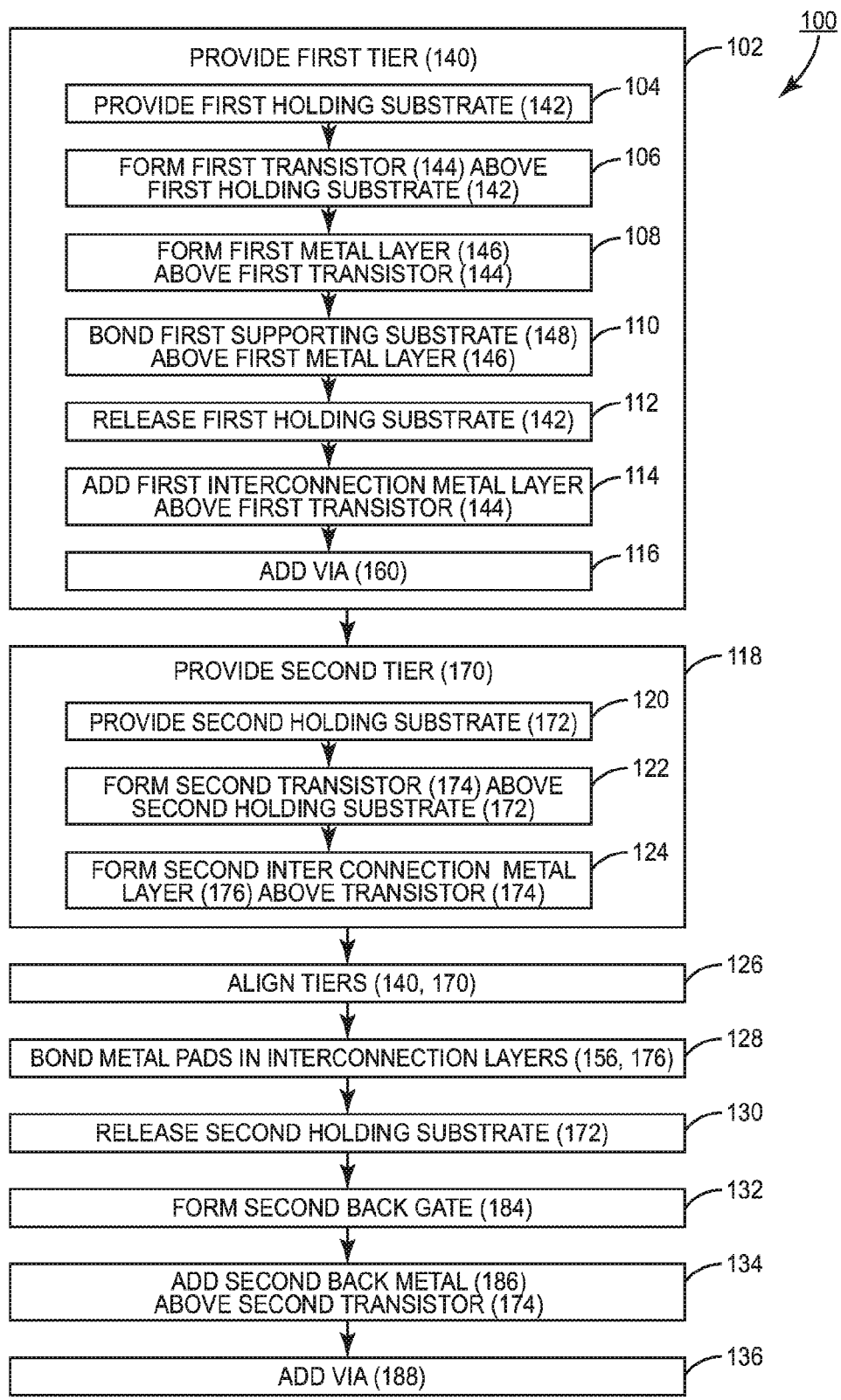
FIG. 6 is a flow chart of another exemplary method to construct a 3DIC according to an exemplary aspect of the present disclosure.
Figure 7:
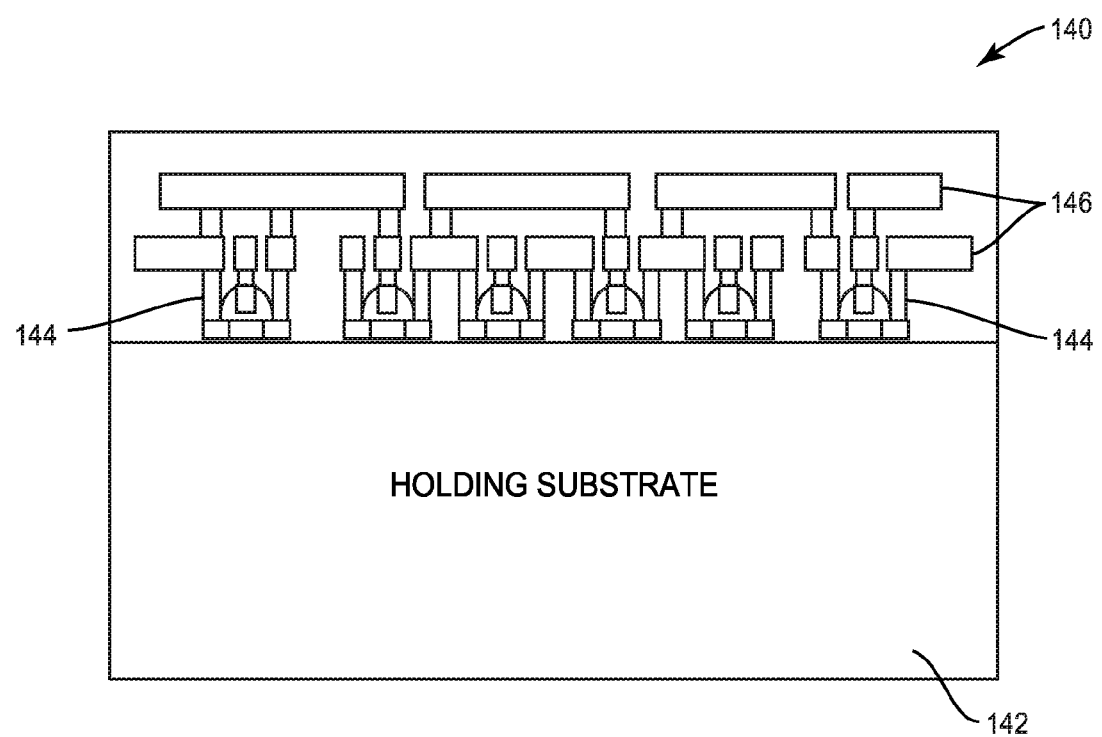
FIG. 7 is a simplified cross-sectional view of a first tier of a 3DIC formed according to the process of FIG. 6.

In this regard, process 100, illustrated in FIG. 6, begins by providing a first tier 140 (block 102, see FIG. 7). Providing the first tier 140 begins by providing a first holding substrate 142 (block 104, see FIG. 7). The first holding substrate 142 may be an insulator, such as glass, or it may be bulk silicon. A first transistor(s) 144 are formed above (or on) the first holding substrate 142 (block 106, see FIG. 7). First metal layer(s) 146 are formed above the first transistor(s) 144 (block 108, see FIG. 7). While only two first metal layers 146 are illustrated, it should be appreciated that more may be present if needed or desired.

Figure 8:
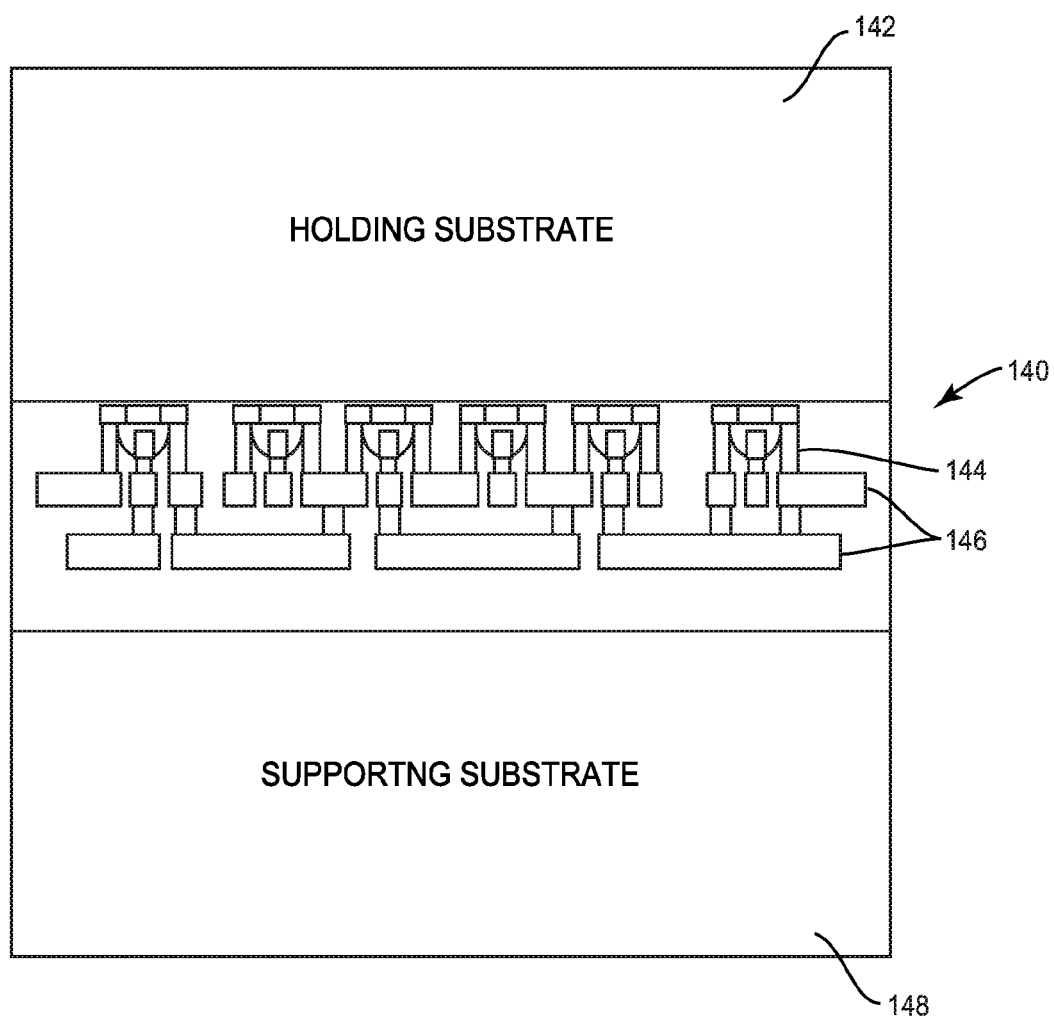
FIG. 8 is a simplified cross-sectional view of the first tier with a supporting substrate added according to the process of FIG. 6.
Figure 9:
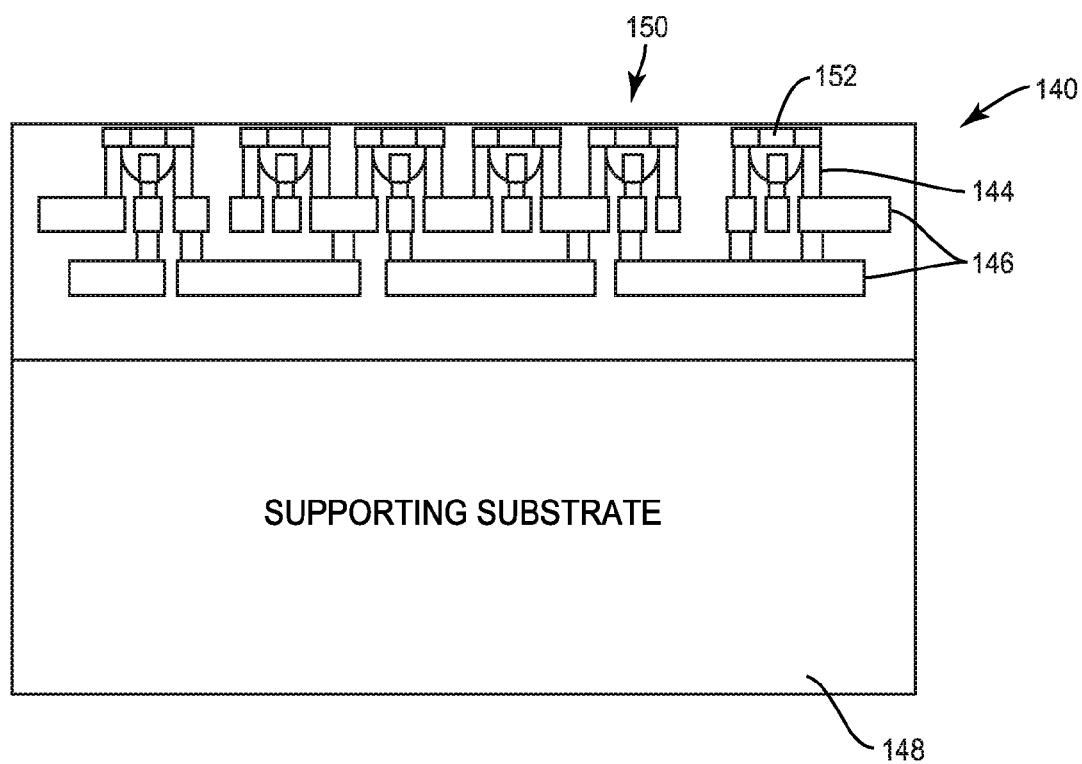
FIG. 9 is a simplified cross-sectional view of the first tier of FIG. 8 with the holding substrate removed according to the process of FIG. 6.

With continued reference to FIG. 6, providing the first tier 140 continues by bonding a first supporting substrate 148 above the first metal layers 146 (block 110, see FIG. 8). The first tier 140 is then turned upside down (illustrated in FIG. 8) and the first holding substrate 142 is released (block 112, see FIG. 9). As noted above with reference to process 10, releasing may be done through etching, CMP, ion cutting or other technique. The release of the first holding substrate 142 may expose first back surface 150 and particularly expose or nearly expose a gate 152 of the first transistor 144. After exposing the back surface 150, first back gates 154 may optionally be added proximate exposed gates 152 (see FIG. 9). Providing first back gates 154 allows the $V_T$ of the first transistors 144 to be controlled, thereby allowing greater flexibility in circuit design.

Figure 10:
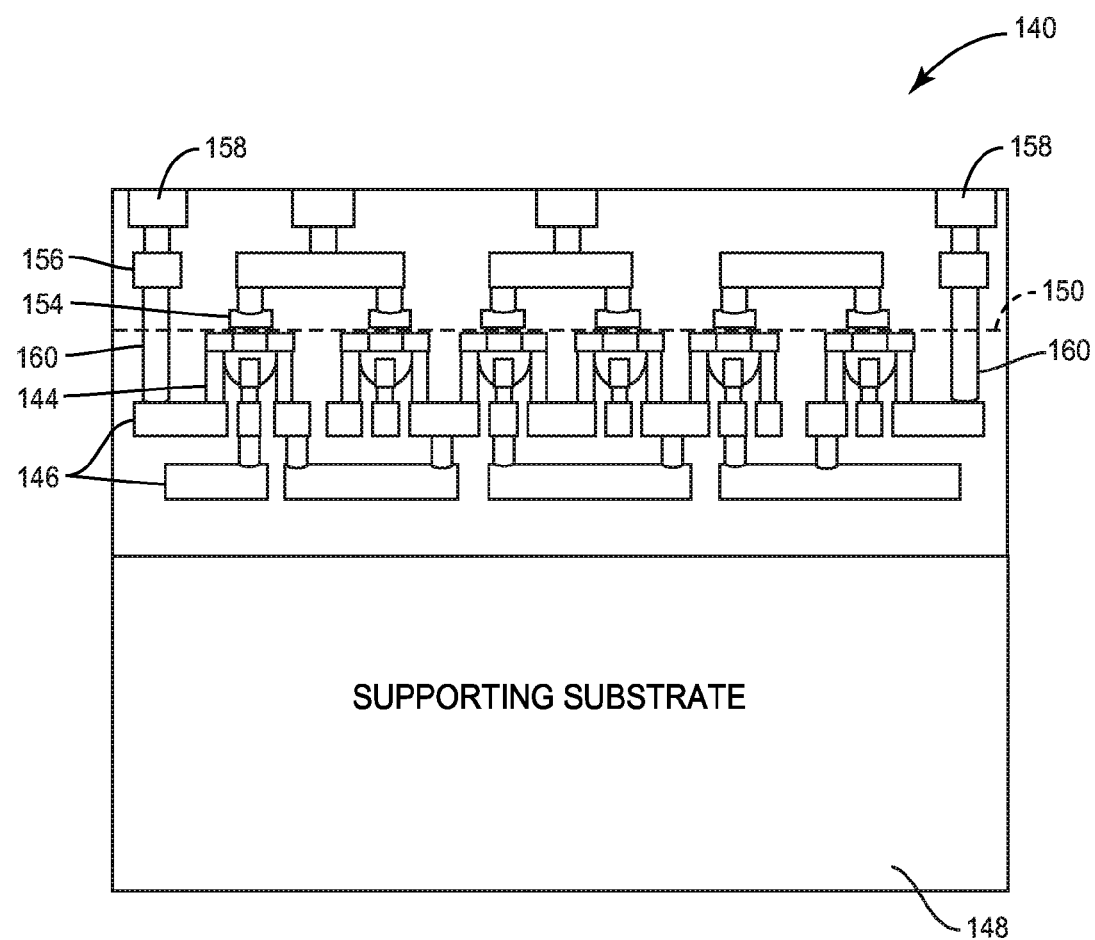
FIG. 10 is a simplified cross-sectional view of the first tier with additional metal layers and vias added according to the process of FIG. 6.

With continued reference to FIG. 6, first interconnection metal layers 156 are then added above the first transistor(s) 144 (block 114, see FIG. 10). When creating the first interconnection metal layers 156, first metal bonding pads 158 may also be created. Additionally, vias 160 may be created coupling the first interconnection metal layers 156 to the first metal layers 146 (block 116, see FIG. 10).

Figure 11:
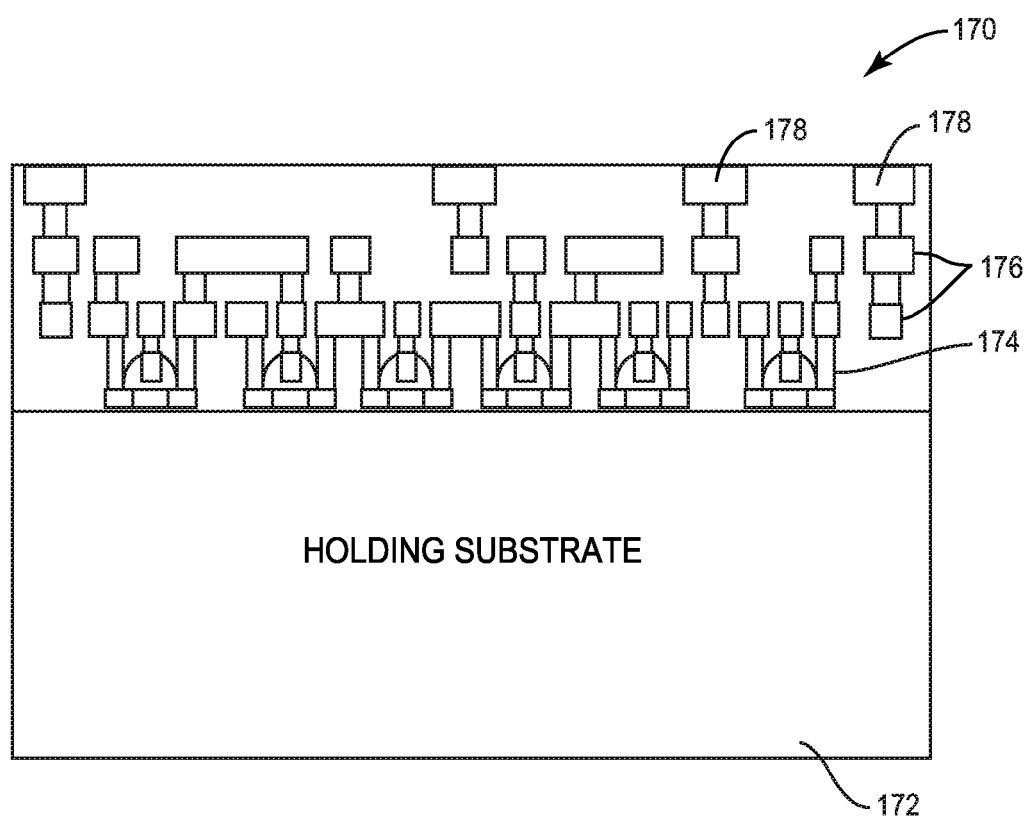
FIG. 11 is a simplified cross-sectional view of a second tier of a 3DIC formed according to the process of FIG. 6.

With continued reference to FIG. 6, process 100 continues by providing a second tier 170 (block 118, see FIG. 11). Providing the second tier 170 includes providing a second holding substrate 172 (block 120, see FIG. 11). As with the first holding substrate 142, the second holding substrate 172 may be an insulator or bulk silicon. Active elements are formed on the second holding substrate 172. In an exemplary aspect, the active elements include at least one second transistor 174 formed above the second holding substrate 172 (block 122, see FIG. 11). A second interconnection metal layer(s) 176 is formed above the second transistor(s) 174 (block 124, see FIG. 11). While only two second interconnection metal layers 176 are illustrated, more may be provided if needed or desired. Second interconnection metal layer 176 provides interconnection between active elements within the second tier 170 (e.g., between two second transistors 174). During creation of the second interconnection metal layer 176, second metal bonding pad(s) 178 may also be formed.

Figure 12:
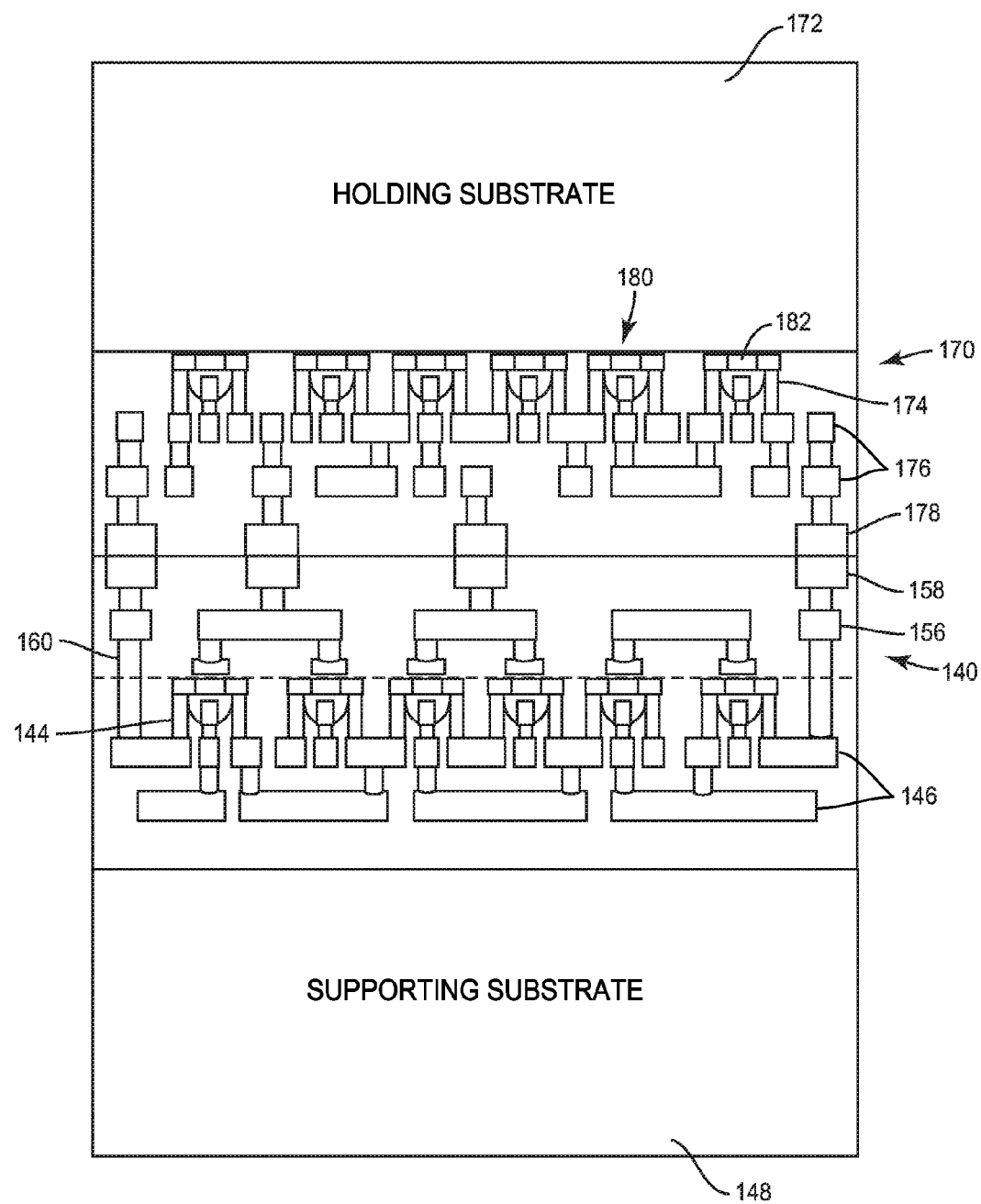
FIG. 12 is a simplified cross-sectional view of the second tier of FIG. 11 bonded to the first tier of FIG. 10 according to the process of FIG. 6.

With continued reference to FIG. 6, process 100 continues by flipping the second tier 170 over and onto the first tier 140 and aligning the tiers 140, 170 (block 126, see FIG. 12). In particular, the metal bonding pads 158 and 178 are aligned. Once aligned, the metal bonding pads 158, 178 of the interconnection metal layers 156, 176 are bonded (block 128, see FIG. 12) such as by oxide bonding. In addition to bonding the first tier 140 to the second tier 170, this arrangement electrically interconnects interconnection metal layers 156, 176 such that elements within the first tier 140 may be electrically interconnected to elements in the second tier 170. Oxide bonding is also able to be done at relatively low temperatures. Use of such low temperatures reduces the chance of metal damage from melting the interconnection metal layers 156, 176.

Figure 13:
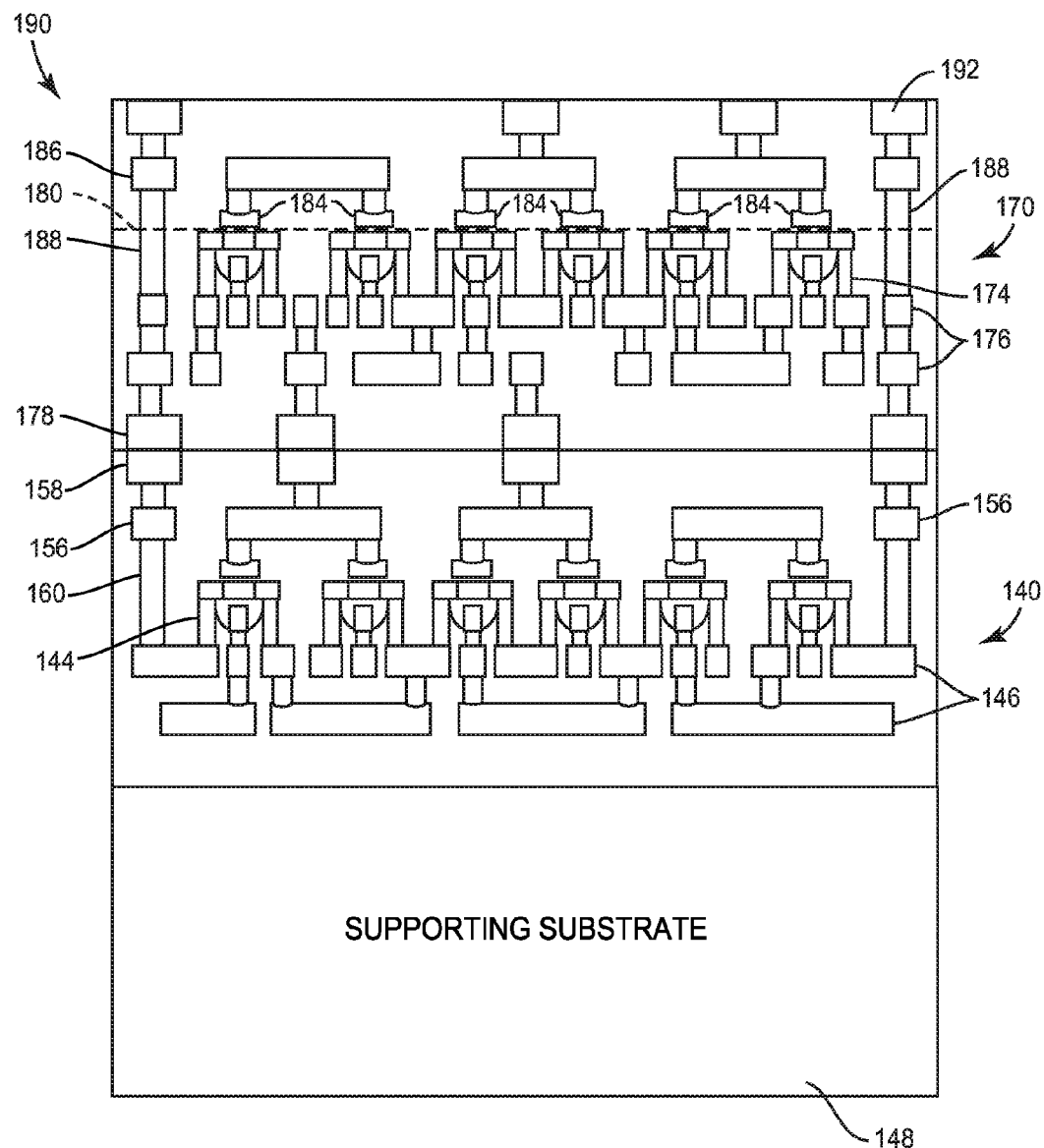
FIG. 13 is a simplified cross-sectional view of the 3DIC of FIG. 12 with additional metal layers and vias added to the second tier according to the process of FIG. 6.

With continued reference to FIG. 6, process 100 continues by releasing the second holding substrate 172 (block 130, see FIG. 13). Releasing the second holding substrate 172 may be done by ion cutting, etching, CMP, or other technique. In an exemplary aspect of the present disclosure, releasing of the second holding substrate 172 exposes a second back surface 180 of a second gate 182 of the second transistor 174. Where the holding type of material of the second holding substrate 172 is an insulator, the releasing of the second holding substrate 172 may thin the second back surface 180 to the transition between the insulator and the silicon body (i.e., the transistor type of material). Such transition is relatively easy to detect. Where the second holding substrate 172 is bulk silicon, the thinning may be measured to achieve a desired thickness.

With continued reference to FIG. 6, process 100 continues with the formation of a second back gate 184 on the exposed second back surface 180 (block 132, see FIG. 13). Use of second back gate 184 allows the $V_T$ of the second transistors 174 to be varied as is well understood, providing greater flexibility for the 3DIC 190. Additional second back metal layer(s) 186 are formed above the second transistor 174 (block 134, see FIG. 13). Note that because the second transistor 174 has flipped upside down, "above" is now the opposite of the "above" in block 124. To this extent, as used herein, terms like "above" are intended to convey relative position and not absolute positions. Additionally, vias 188 are created between the second back metal layers 186 and the second interconnection metal layers 176 (block 136, see FIG. 13). If additional tiers are to be added beyond the first tier 140 and the second tier 170, additional second back metal bonding pads 192 may be formed with the second back metal layers 186.

The 3DICs 90, 190 created according to the methods for constructing 3DIC and related systems according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

In this regard, FIG. 14 illustrates an example of a processor-based system 200 that can employ the 3DICs 90, 190 illustrated in FIGS. 5 and 13. In this example, the processor-based system 200 includes one or more central processing units (CPUs) 202, each including one or more processors 204. The CPU(s) 202 may have cache memory 206 coupled to the processor(s) 204 for rapid access to temporarily stored data. The CPU(s) 202 is coupled to a system bus 208 and can intercouple devices included in the processor-based system 200. As is well known, the CPU(s) 202 communicates with these other devices by exchanging address, control, and data information over the system bus 208. For example, the CPU(s) 202 can communicate bus transaction requests to the memory system 210.

Other devices can be connected to the system bus 208. As illustrated in FIG. 14, these devices can include the memory system 210, one or more input devices 212, one or more output devices 214, one or more network interface devices 216, and one or more display controllers 218, as examples. The input device(s) 212 can include any type of input device, including but not limited to input keys, switches, voice processors, etc. The output device(s) 214 can include any type of output device, including but not limited to audio, video, other visual indicators, etc. The network interface device(s) 216 can be any devices configured to allow exchange of data to and from a network 220. The network 220 can be any type of network, including but not limited to a wired or wireless network, a private or public network, a local area network (LAN), a wide local area network (WLAN), and the Internet. The network interface device(s) 216 can be configured to support any type of communication protocol desired.

The CPU(s) 202 may also be configured to access the display controller(s) 218 over the system bus 208 to control information sent to one or more displays 222. The display controller(s) 218 sends information to the display(s) 222 to be displayed via one or more video processors 224, which process the information to be displayed into a format suitable for the display(s) 222. The display(s) 222 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein, may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor, such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A three dimensional (3D) integrated circuit (IC) (3DIC), comprising:
    a first tier comprising:
        a first holding substrate;
        a first transistor positioned above the first holding substrate; and
        a first interconnection metal layer positioned above the first transistor, wherein the first interconnection metal layer comprises a first metal bonding pad; and
    a second tier comprising:
        a second interconnection metal layer comprising a second metal bonding pad bonded to the first metal bonding pad;
        a second transistor positioned above the second interconnection metal layer, the second transistor comprising a second gate and a second gate back surface; and
        a second back gate bias positioned above and proximate the second gate back surface.

2. The 3DIC of claim 1, further comprising a second back metal layer positioned above the second back gate bias.

3. The 3DIC of claim 2, further comprising a via coupling the second back metal layer to the second interconnection metal layer.

4. The 3DIC of claim 2, wherein the second back metal layer comprises a second back metal bonding pad.

5. The 3DIC of claim 1, wherein the first holding substrate comprises a silicon holding substrate.

6. The 3DIC of claim 1, wherein the first holding substrate comprises a glass holding substrate.

7. The 3DIC of claim 1, further comprising a first back gate bias positioned proximate a gate of the first transistor.

8. A three dimensional (3D) integrated circuit (IC) (3DIC) comprising:
    a first tier comprising:
        a first holding substrate;
        a first interconnection metal layer positioned above the first holding substrate;
        a first transistor positioned above the first interconnection metal layer;
        a first metal back layer positioned above the first transistor, wherein the first metal back layer comprises a first metal bonding pad; and
        a via coupling the first metal back layer to the first interconnection metal layer; and
    a second tier comprising:
        a second interconnection metal layer comprising a second metal bonding pad bonded to the first metal bonding pad;
        a second transistor positioned above the second interconnection metal layer, the second transistor comprising a second gate and a second gate back surface; and
        a second back gate bias positioned above and proximate the second gate back surface.

9. The 3DIC of claim 8, further comprising a second back metal layer positioned above the second back gate bias.

10. The 3DIC of claim 9, further comprising a via coupling the second back metal layer to the second interconnection metal layer.

11. The 3DIC of claim 9, wherein the second back metal layer comprises a second back metal bonding pad.

12. The 3DIC of claim 8, further comprising a first back gate bias positioned proximate a gate of the first transistor.

13. The 3DIC of claim 1 integrated into a device selected from the group consisting of: a set top box; an entertainment unit; a navigation device; a communications device; a fixed location data unit; a mobile location data unit; a mobile phone; a cellular phone; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; and a portable digital video player.

14. The 3DIC of claim 8 integrated into a device selected from the group consisting of: a set top box; an entertainment unit; a navigation device; a communications device; a fixed location data unit; a mobile location data unit; a mobile phone; a cellular phone; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; and a portable digital video player.

\* \* \* \* \*